United States Patent
Fujita et al.

(10) Patent No.: US 8,592,278 B2
(45) Date of Patent: Nov. 26, 2013

(54) METHOD OF MANUFACTURING SEMICONDUCTOR DEVICE

(75) Inventors: Kazushi Fujita, Yokohama (JP); Junji Oh, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 357 days.

(21) Appl. No.: 13/177,337

(22) Filed: Jul. 6, 2011

(65) Prior Publication Data

US 2012/0083082 A1 Apr. 5, 2012

(30) Foreign Application Priority Data

Sep. 30, 2010 (JP) ................. 2010-220773

(51) Int. Cl.
*H01L 21/336* (2006.01)
(52) U.S. Cl.
USPC .................................... 438/270; 257/E21.41
(58) Field of Classification Search
None
See application file for complete search history.

(56) References Cited

U.S. PATENT DOCUMENTS

| | | | |
|---|---|---|---|
| 6,426,279 B1 | 7/2002 | Huster et al. | |
| 6,482,714 B1 | 11/2002 | Hieda et al. | |
| 8,294,217 B2 * | 10/2012 | Ema et al. | 257/368 |
| 8,476,124 B2 * | 7/2013 | Oh | 438/162 |

FOREIGN PATENT DOCUMENTS

JP 2010-161114 A 7/2010

OTHER PUBLICATIONS

A. Asenov et al., "Suppression of Random Dopant-Induced Threshold Voltage Fluctuations in Sub-0.1-μm MOSFET's with Epitaxial and δ-doped Channels", IEEE Transactions on Electron Devices, 1999, vol. 46, No. 8, pp. 1718-1724.
W. Lee, "MOS Device Structure Development for ULSI: Low Power/High Speed Operation", Microelectron. Reliab., 1997, vol. 37, No. 9, pp. 1309-1314.
A. Hokazono et al., "Steep Channel Profiles in n/pMOS Controlled by Boron-Doped Si:C Layers for Continual Bulk-CMOS Scaling", IEDM09-673-IEDM09-676.

* cited by examiner

*Primary Examiner* — Seahvosh Nikmanesh
(74) *Attorney, Agent, or Firm* — Westerman, Hattori, Daniels & Adrian, LLP

(57) ABSTRACT

The method of manufacturing the semiconductor device includes forming a trench to be an alignment mark in a semiconductor substrate, forming a mask film exposing a region to be a device isolation region and covering a region to be a device region by aligning with the alignment mark above the semiconductor substrate with the trench formed in, anisotropically etching the semiconductor substrate with the mask film as a mask to form a device isolation trench in the region to be the device isolation region of the semiconductor substrate, and burying the device isolation trench by an insulating film to form a device isolation insulating film. In forming the trench, the trench is formed in a depth which is smaller than a depth equivalent to a thickness of the mask film.

6 Claims, 26 Drawing Sheets

METHOD OF MANUFACTURING SEMICONDUCTOR DEVICE

CROSS REFERENCE TO RELATED APPLICATIONS

This application is based upon and claims the benefit of priority of the prior Japanese Patent Application No. 2010-220773, filed on Sep. 30, 2010, the entire contents of which are incorporated herein by reference.

FIELD

The embodiments discussed herein are related to a method of manufacturing a semiconductor device.

BACKGROUND

As semiconductor devices are downsized and highly integrated, the fluctuations of the threshold voltages of the transistors due to statistical fluctuations of the channel impurity becomes conspicuous. The threshold voltage is one of important parameters for deciding the performance of the transistors, and to manufacture semiconductor device of high performance and high reliability, it is important to decrease the fluctuations of the threshold voltage due to the statistical fluctuations of the impurity.

As one technique of decreasing the fluctuations of the threshold voltage due to the statistical fluctuations is proposed the technique that a non-doped epitaxial silicon layer is formed on a highly doped channel impurity layer having a steep impurity concentration distribution.

The following are examples of related: Japanese Laid-open Patent Publication No. 2010-161114; U.S. Pat. No. 6,426,279; U.S. Pat. No. 6,482,714; A. Asenov, "Suppression of Random Dopant-Induced Threshold Voltage Fluctuations in Sub-0.1-μm MOSFET's with Epitaxial and δ-doped Channels", IEEE Transactions on Electron Devices, vol. 46, No. 8. p. 1718, 1999; Woo-Hyeong Lee, "MOS Device Structure Development for ULSI: Low Power/High Speed Operation", Microelectron. Reliab., Vol. 37, No. 9, pp. 1309-1314, 1997; and A. Hokazono et al., "Steep Channel Profiles in n/pMOS Controlled by Boron-Doped Si:C Layers for Continual Bulk-CMOS Scaling", IEDM09-673.

No method for incorporating the proposed techniques described above in the semiconductor device manufacturing processes have been specifically proposed. Especially, new problems which will take place by adopting the above-described techniques in manufacturing processes, and their solving means have not been specifically studied.

SUMMARY

According to one aspect of an embodiment, there is provided a method of manufacturing a semiconductor device including forming a trench to be an alignment mark in a semiconductor substrate, forming a mask film exposing a region to be a device isolation region and covering a region to be a device region by aligning with the alignment mark above the semiconductor substrate with the trench formed in, anisotropically etching the semiconductor substrate with the mask film as a mask to form a device isolation trench in the region to be the device isolation region of the semiconductor substrate, and burying the device isolation trench by an insulating film to form a device isolation insulating film, wherein in forming the trench, the trench is formed in a depth which is smaller than a depth equivalent to a thickness of the mask film.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A semiconductor device and a method of manufacturing a semiconductor device according to an embodiment will be described with reference to FIGS. 1 to 26B.

Figure 1:
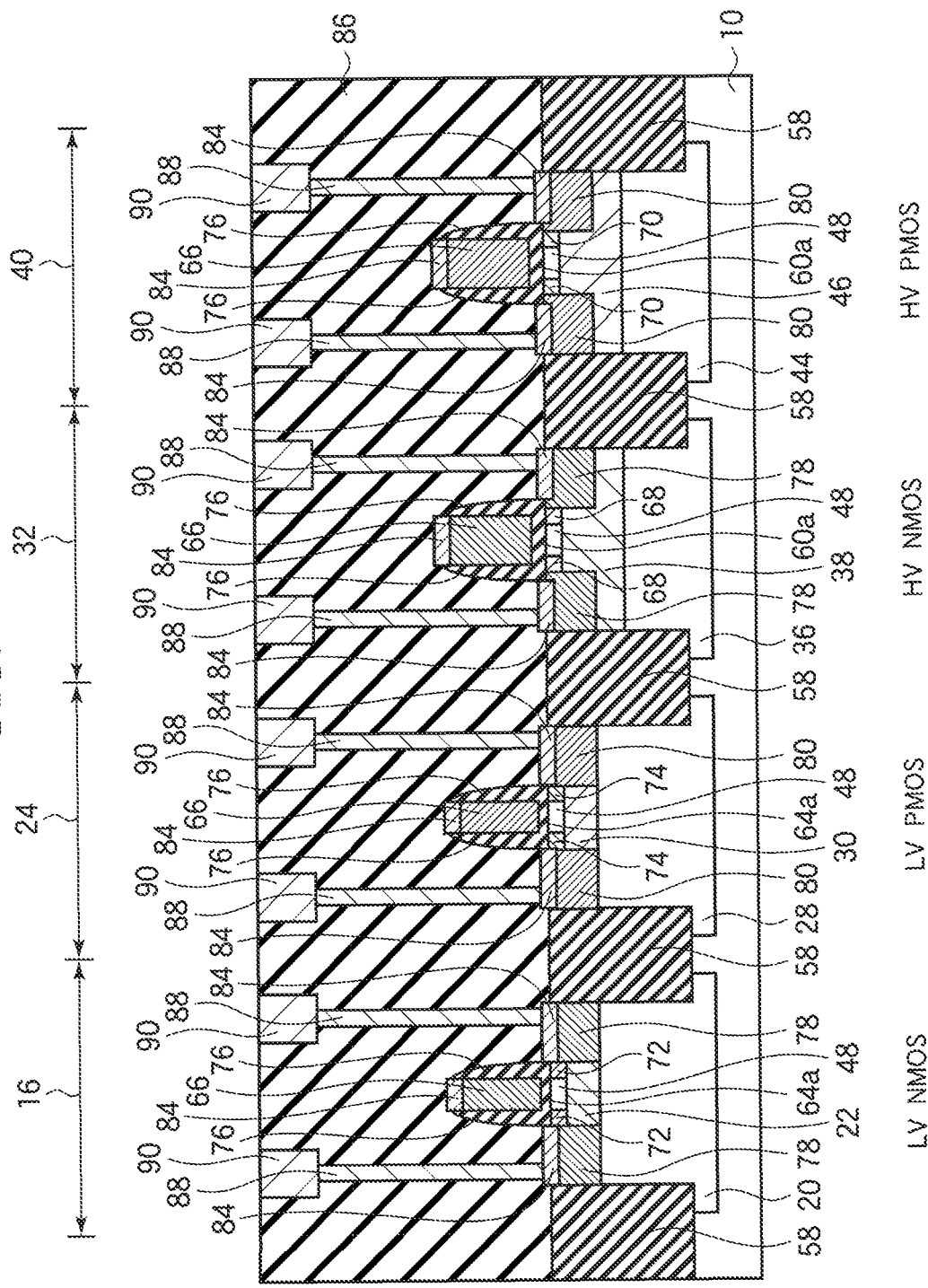
FIG. 1 is a diagrammatic sectional view illustrating a structure of a semiconductor device according to a first embodiment.

FIG. 1 is a diagrammatic sectional view illustrating a structure of the semiconductor device according to the present embodiment. FIGS. 2-17 are sectional views illustrating a method of manufacturing the semiconductor device according to the present embodiment. FIGS. 18A-26B are sectional views explaining effects of the method of manufacturing the semiconductor device according to the embodiment.

First, the structure of the semiconductor device according to the present embodiment will be described with reference to FIGS. 1 and 2.

Above a silicon substrate 10, a low-voltage NMOS transistor (LV NMOS) and a low-voltage PMOS transistor (LV PMOS), a high-voltage NMOS transistor (HV NMOS) and a high-voltage PMOS transistor (HV PMOS) are formed. The low voltage transistors are used mainly in the circuit units which require high-speed operation. The high voltage transistors are used in circuit units, such as a 3.3 V I/O, etc., high voltages are applied to.

The low voltage NMOS transistor (LV NMOS) is formed in a low voltage NMOS transistor forming region 16 of the silicon substrate 10.

In the silicon substrate 10 in the low voltage NMOS transistor forming region 16, a p-well 20 and a p-type highly doped impurity layer 22 are formed. Above the p-type highly doped impurity layer 22, a silicon layer 48 epitaxially grown on the silicon substrate 10 is formed. Above the silicon layer 48, a gate insulating film 64a is formed. Above the gate insulating film 64a, a gate electrode 66 is formed. In the silicon layer 48 and the silicon substrate 10 on both sides of a gate electrode 66, source/drain regions 78 are formed. Thus, the low voltage NMOS transistor (LV NMOS) is formed.

The low voltage PMOS (LV PMOS) is formed in the low voltage PMOS transistor forming region 24 of the silicon substrate 10.

In the silicon substrate 10 in the low voltage PMOS transistor forming region 24, an n-well 28 and an n-type highly doped impurity layer 30 are formed. Above the n-type highly doped impurity layer 30, a silicon layer 48 epitaxially grown on the silicon substrate 10 is formed. Above the silicon layer 48, a gate insulating film 64a is formed. Above the gate insulating film 64a, a gate electrode 66 is formed. In the silicon layer 48 and the silicon substrate 10 on both sides of the gate electrode 66, source/drain regions 80 are formed. Thus, the low voltage PMOS transistor (LV PMOS) is formed.

The high voltage NMOS transistor (HV NMOS) is formed in a high voltage NMOS transistor forming region 32 of the silicon substrate 10.

In the silicon substrate 10 in the high voltage NMOS transistor forming region 32, a p-well 36 and a p-type impurity layer 38 are formed. To improve the junction breakdown voltage, the p-type impurity layer 38 has a lower concentration and a gradual impurity distribution than the p-type highly doped impurity layer 22 of the low voltage NMOS transistor. Above the p-type impurity layer 38, a silicon layer 48 epitaxially grown on the silicon substrate 10 is formed. Above the silicon layer 48, a gate insulating film 60a thicker than the gate insulating films 64a of the low voltage transistors is formed. Above the gate insulating film 60a, a gate electrode 66 is formed. In the silicon layer 48 and the silicon substrate 10 on both sides of the gate electrode 66, source/drain regions 78 are formed. Thus, the high voltage NMOS transistor (HV NMOS) is formed.

A high voltage PMOS transistor (HV PMOS) is formed in a high voltage PMOS transistor forming region 40 of the silicon substrate 10.

In the silicon substrate 10 in the high voltage PMOS transistor forming region 40, an n-well 44 and an n-type impurity layer 46 are formed. To improve the junction breakdown voltage, the n-type impurity layer 46 has a lower concentration and a gradual impurity distribution than the n-type highly doped impurity layer 30 of the low voltage PMOS transistor. Above the n-type impurity layer 46, a silicon layer 48 epitaxially grown on the silicon substrate 10 is formed. Above the silicon layer 48, a gate insulating film 60a thicker than the gate insulating films 64a of the low voltage transistors is formed. Above the gate insulating film 60a, a gate electrode 66 is formed. In the silicon layer 48 and the silicon substrate 10 on both sides of the gate electrode 66, source/drain regions 80 are formed. Thus, the high voltage PMOS transistor (HV PMOS) is formed.

Above the gate electrodes 66 and the source/drain regions 78, 80 of the respective transistors, a metal silicide film 84 is formed.

Above the silicon substrate 10 with the transistors of the four kinds formed on, an inter-layer insulating film 86 is formed. In the inter-layer insulating film 86, contact plugs 88 connected to the transistors are buried. To the contact plugs 88, interconnections 90 are connected.

As described above, the semiconductor device according to the present embodiment includes two kinds of low voltage transistors and two kinds of high voltage transistors.

Next, the method of manufacturing the semiconductor device according to the present embodiment will be described with reference to FIGS. 2 to 21. FIGS. 2 to 17 are sectional views of the semiconductor device in the steps of its manufacturing method, which include the regions for the 4 kinds of transistors. FIGS. 18 and 19 are sectional views of the semiconductor device in the steps of its manufacturing method, which enlarge the alignment mark forming region.

Figure 18A:
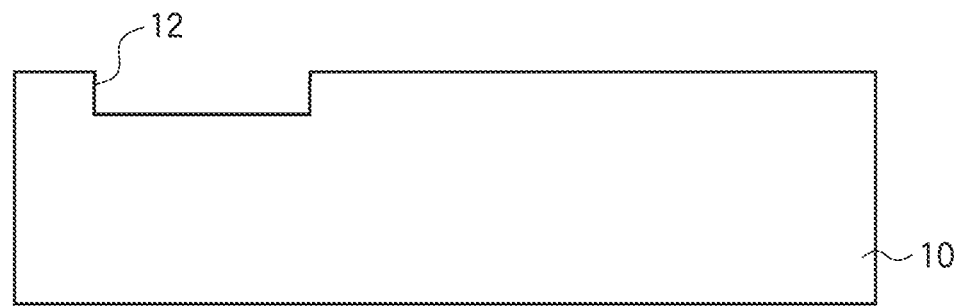
FIGS. 18A-18B, 19A-19B, 20A-20B, 21A-21B, 22A-22B, 23A-23B, 24A-24B, 25 and 26A-26B are sectional views explaining effects of the method of manufacturing the semiconductor device according to the embodiment.

First, by photolithography and etching, a trench to be used as the mark for the mask alignment is formed in a region other than the product to be formed region of the silicon substrate 10 (e.g., a scribe region) (FIG. 18A). The trench 12 is formed in a depth smaller than a film thickness of a silicon nitride film 54 to be formed in a later step. The depth is set at, e.g., 70 nm here.

In the method of manufacturing the semiconductor device according to the present embodiment, before device isolation insulating film 58 is formed, the wells and the channel impurity layers are formed. The trench 12 is used as the mark for the mask alignment in the lithography process made before the device isolation insulating film 58 is formed (e.g., the lithography process for forming the wells and the channel impurity layers).

The wells and the channel impurity layers are formed before the device isolation insulating film 58 is formed so as to suppress the film thickness decrease of the device isolation insulating film 58 in removing the silicon oxide films 14, 52, 60.

Figure 2:
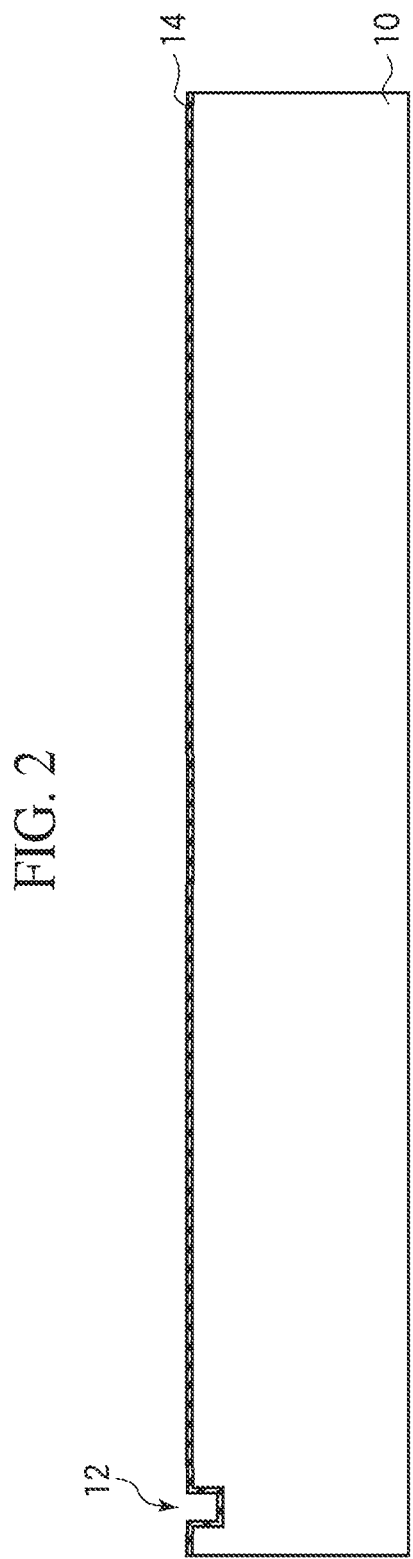
FIGS. 2-17 are sectional views illustrating a method of manufacturing the semiconductor device according to the embodiment.

Next, above the entire surface of the silicon substrate 10, a silicon oxide film 14 as the protection film of the surface of the silicon substrate 10 is formed by, e.g., thermal oxidation method (FIG. 2).

Next, by photolithography, a photoresist film 18 exposing the low voltage NMOS transistor forming region and covering the rest region is formed. For the alignment for the photolithography, the trench 12 is used as the alignment mark.

Figure 3:
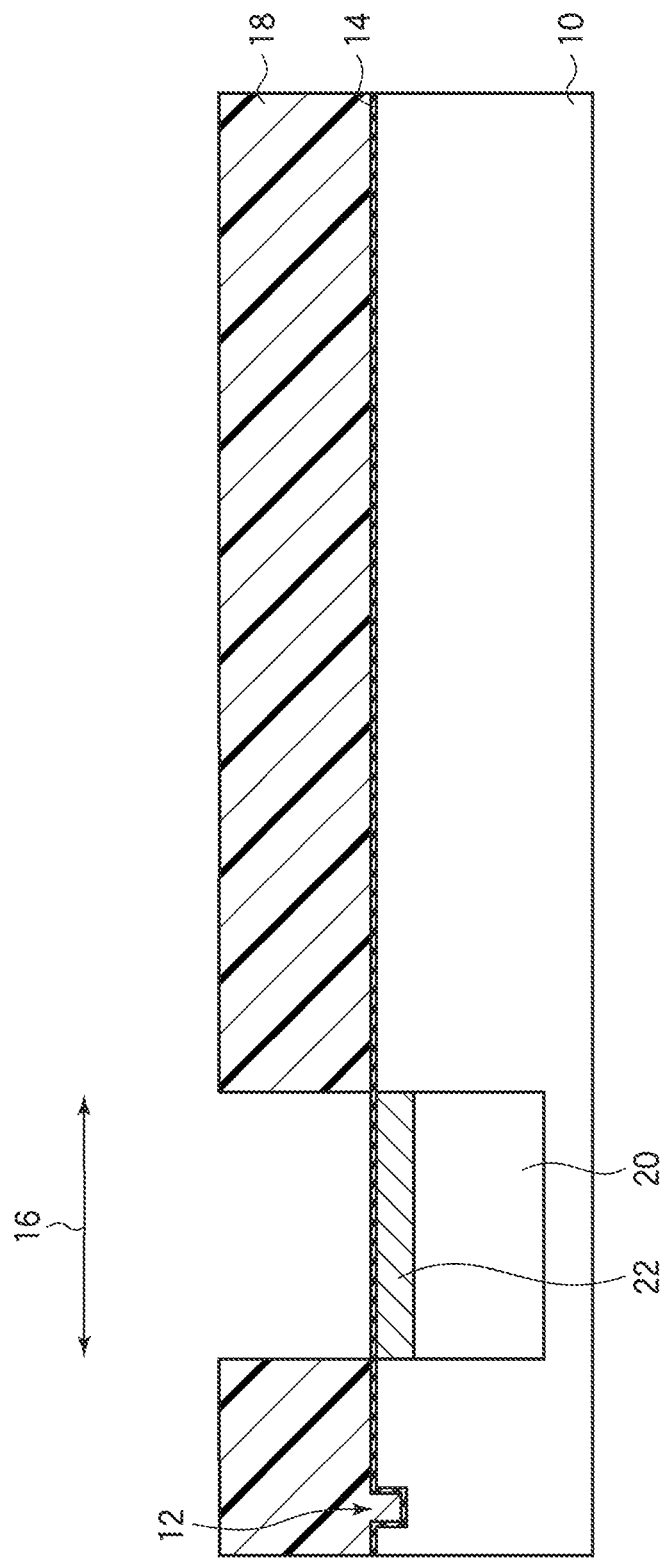

Next, ion implantation is made with the photoresist film 18 as the mask to form a p-well 20 and a p-type highly doped impurity layer 22 in the low voltage NMOS transistor forming region 16 (FIG. 3).

The p-well 20 is formed, e.g., by implanting boron ions ($B^+$) respectively in 4 directions tilted to the normal direction of the substrate under the conditions of 150 keV acceleration energy and $7.5 \times 10^{12}$ cm$^{-2}$ dose. The p-type highly doped impurity layer 22 is formed, e.g., by respectively implanting germanium ions ($Ge^-$) under the conditions of 50 keV acceleration energy and $5 \times 10^{14}$ cm$^{-2}$, carbon ions ($C^+$) under the conditions of 3 keV acceleration energy and $3 \times 10^{14}$ cm$^{-2}$ and boron ions ($B^+$) under the conditions of 2 keV acceleration energy and $3 \times 10^{13}$ cm$^{-2}$. Germanium acts to amorphize the silicon substrate 10 to thereby prevent the channeling of the boron ions and amorphize the silicon substrate 10 to increase the probability of positioning the carbon at the lattice points. The carbon positioned at the lattice points acts to suppress the diffusion of boron. In view of this, it is preferable to implant germanium ions before carbon ions and boron ions.

Next, by, e.g., ashing method, the photoresist film 18 is removed.

Then, by photolithography, a photoresist film 26 exposing the low voltage PMOS transistor forming region and covering the rest region is formed. For the alignment for the photolithography, the trench 12 is used as the alignment mark.

Figure 4:
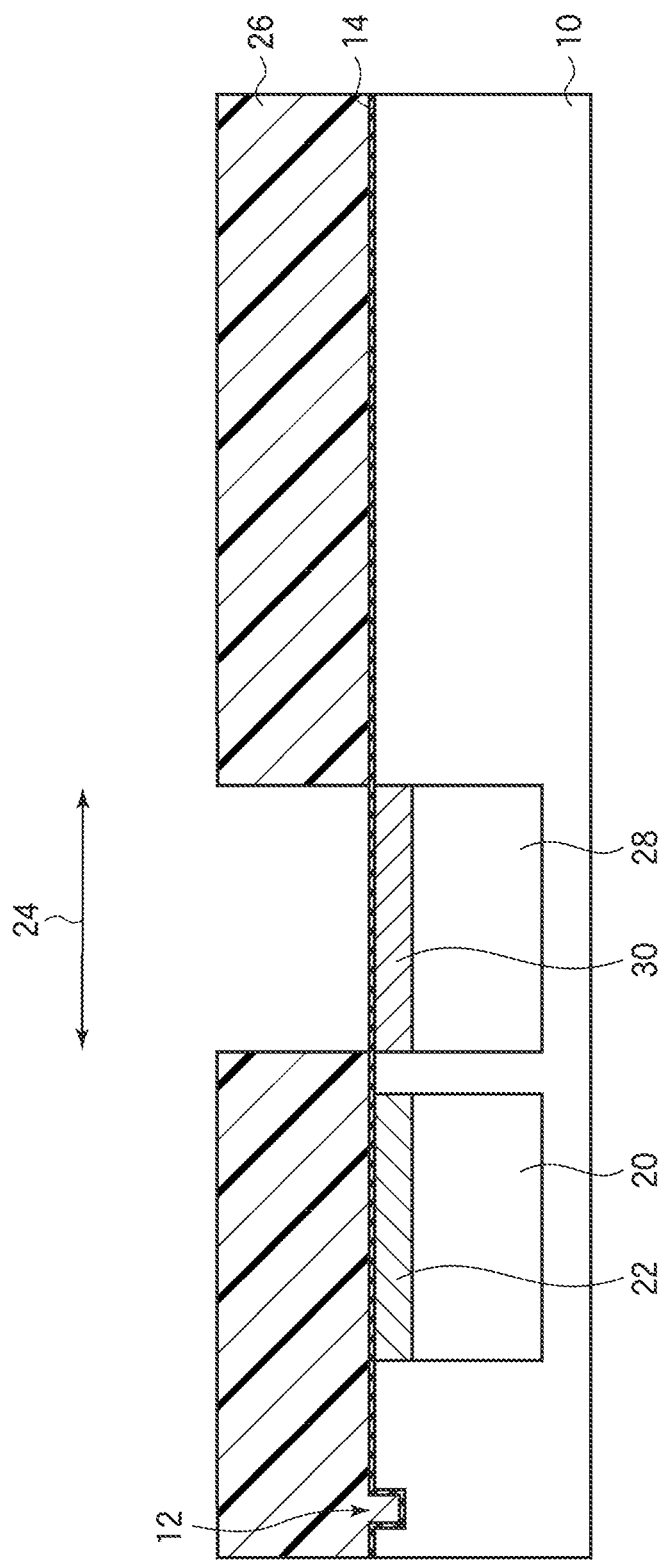
Figure 5:
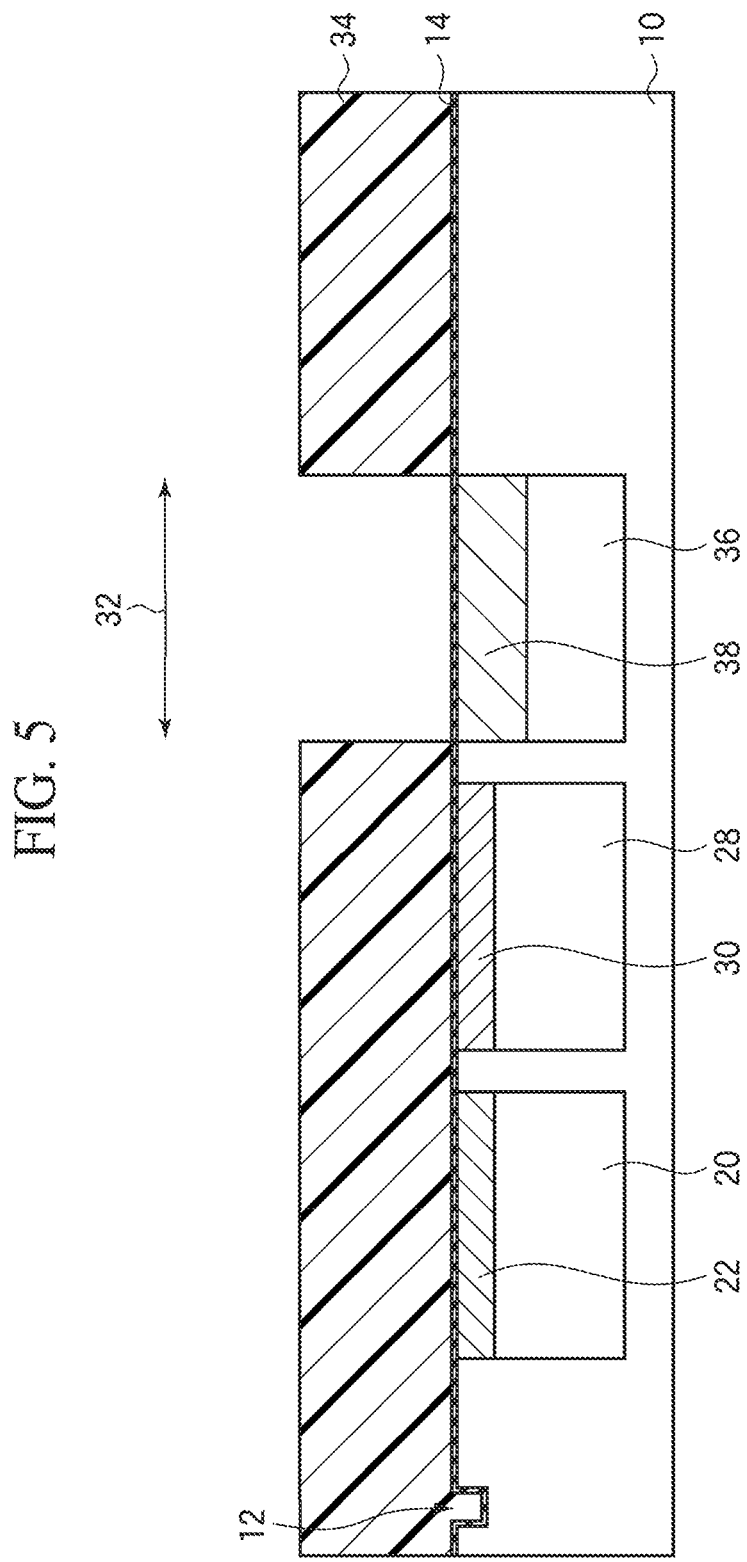

Next, with the photoresist film 26 as the mask, ion implantation is made to form an n-well 28 and an n-type highly doped impurity layer 30 are formed in the low voltage PMOS transistor forming region 24 of the silicon substrate 10 (FIG. 4).

The n-well 28 is formed, e.g., by implanting respectively in 4 directions tilted to the normal direction of the substrate phosphorus ions ($P^+$) under the conditions of 360 keV acceleration energy and $7.5 \times 10^{12}$ cm$^{-2}$ dose and arsenic ions ($As^+$) under the conditions of 80 keV acceleration energy and $6 \times 10^{12}$ cm$^{-2}$ dose. The n-type highly doped impurity layer 30 is formed, e.g., by implanting arsenic ions under the conditions of 6 keV acceleration energy and $2 \times 10^{13}$ cm$^{-2}$ dose, or antimony ions ($Sb^+$) under the conditions of 20 keV-50 keV acceleration energy (e.g., 20 keV) and $0.5 \times 10^{13}$ cm$^{-2}$-$2.0 \times 10^{13}$ cm$^{-2}$ dose (e.g., $1.5 \times 10^{13}$ cm$^{-2}$).

Next, by, e.g., ashing method, the photoresist film 26 is removed.

Then, by photolithography, a photoresist film 34 exposing the high voltage NMOS transistor forming region and covering the rest region is formed. For the alignment for the photolithography, the trench 12 is used as the alignment mark.

Figure 6:
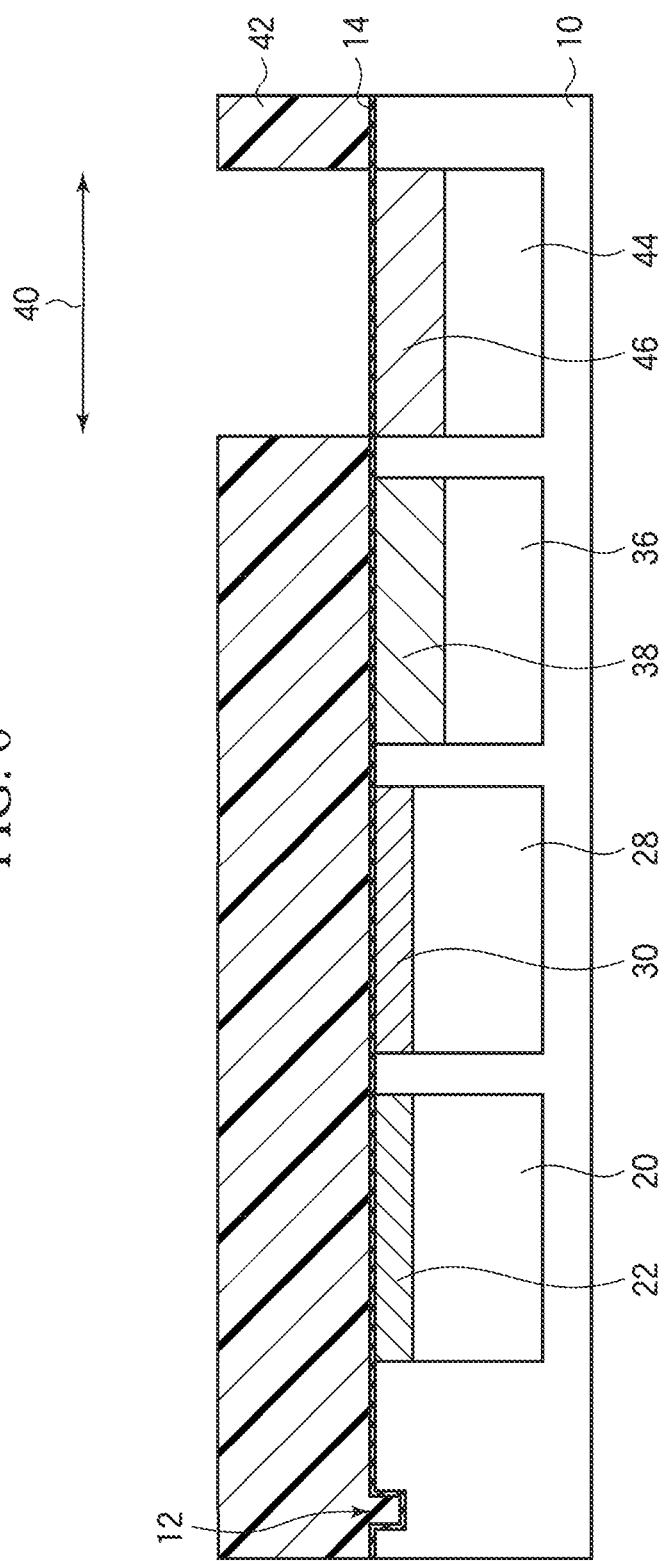

Next, with the photoresist film 34 as the mask, ion implantation is made to form a p-well 36 and a p-type impurity layer 38 in the high voltage NMOS transistor forming region 32 of the silicon substrate 10 (FIG. 6).

The p-well 36 is formed, e.g., by implanting respectively in 4 directions tilted to the normal direction of the substrate boron ions under the conditions of 150 keV acceleration energy and $7.5 \times 10^{12}$ cm$^{-2}$ dose. The p-type impurity layer 38 is formed, e.g., by implanting boron ions under the conditions of 15 keV acceleration energy and $3 \times 10^{12}$ cm$^{-2}$ dose. In the high voltage NMOS transistor, in view of making the impurity concentration distribution of the channel region gradual to thereby improve the junction breakdown voltage and the hot carrier immunity, neither carbon nor germanium is ion implanted.

Next, by, e.g., asking method, the photoresist film 34 is removed.

Next, by photolithography, a photoresist film 42 exposing the high voltage PMOS transistor forming region and covering the reset region is formed. For the alignment for the photolithography, the trench 12 is used as the alignment mark.

Next, with the photoresist film 42 as the mask, ion implantation is made to form an n-well 44 and an n-type impurity layer 46 in the high voltage PMOS transistor forming region 40 of the silicon substrate 10 (FIG. 6).

The n-well 44 is formed, e.g., by implanting respectively in 4 directions tilted to the normal direction of the substrate phosphorus ions at 360 keV acceleration energy and $7.5 \times 10^{12}$ cm$^{-2}$ dose. The n-type impurity layer 46 is formed, e.g., by implanting phosphorus ions at 30 keV acceleration energy and $3 \times 10^{12}$ cm$^{-2}$ dose. In the high voltage PMOS transistor, in view of making the impurity concentration distribution of the channel region gradual to thereby improve the junction breakdown voltage and hot carrier immunity, phosphorus in place of arsenic or antimony is ion implanted.

Next, by, e.g., asking method, the photoresist film 42 is removed.

Next, thermal processing is made in an inert ambient atmosphere to recover ion implantation damages introduced in the silicon substrate 10 while activating the implanted impurities. For example, the thermal processing is made in nitrogen ambient atmosphere on two stages of 600° C. and 150 seconds and 1000° C. and 0 second.

Then, by wet etching with, e.g., hydrofluoric acid aqueous solution, the silicon oxide film 14 is removed.

Figure 7:
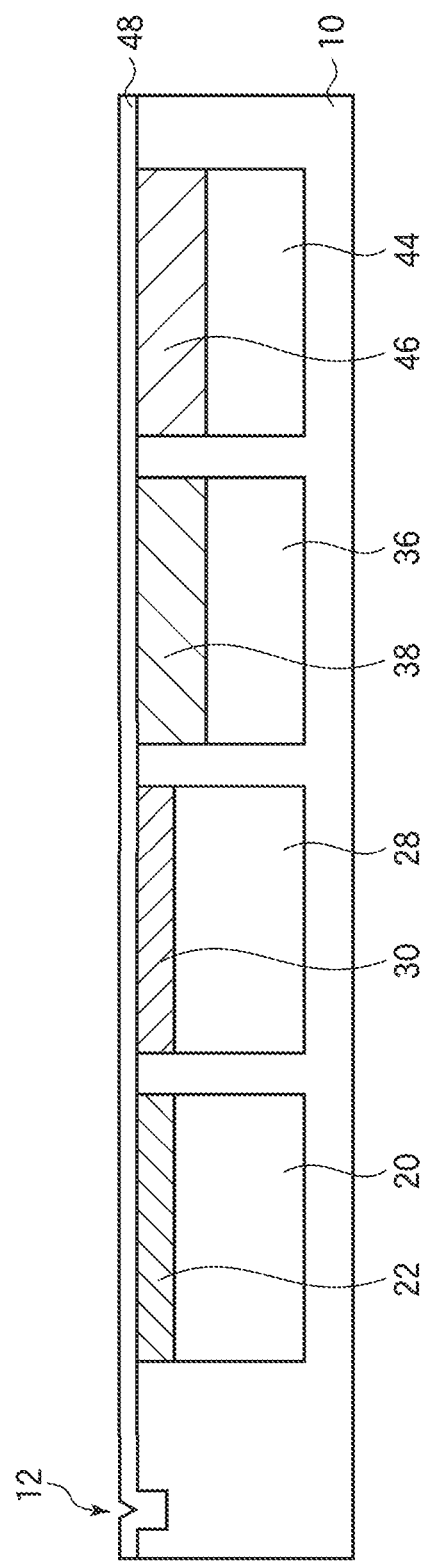

Next, by, e.g., CVD method, a non-doped silicon layer 48 of, e.g., a 30 nm-thickness is grown on the surface of the silicon substrate 10 (FIG. 7).

Because of the film thickness of the silicon layer 48 which is sufficiently smaller than the width of the trench 12 as the alignment mark, even after the silicon layer 48 has been formed on the trench 12, a step of the depth of the trench 12 is formed in the surface of the silicon layer 48.

Next, by, e.g., ISSG (In-Situ Steam Generation) method, the surface of the silicon layer 48 is wet oxidized under a reduced pressure to form a silicon oxide film 52 of, e.g., a 3 nm-thickness. As the processing conditions, for example, the temperature is set at 810° C., and the processing period of time is set at 20 seconds.

Figure 18B:
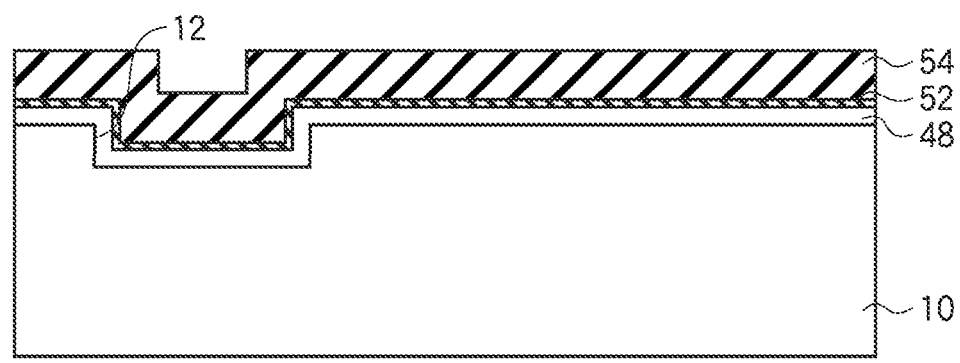

Then, above the silicon oxide film 52, a silicon nitride film 54 of, e.g., a 90 nm-thickness is deposited by, e.g., LPCVD method (FIG. 18B). As the processing conditions, for example, the temperature is set at 700° C., and the processing period of time is set at 60 minutes.

As described above, because of the depth of the trench 12 set smaller than the film thickness of the silicon nitride film 54, the step of the surface of the silicon layer 48 reflecting the trench 12 is completely filled by the silicon nitride film 54.

Figure 8:
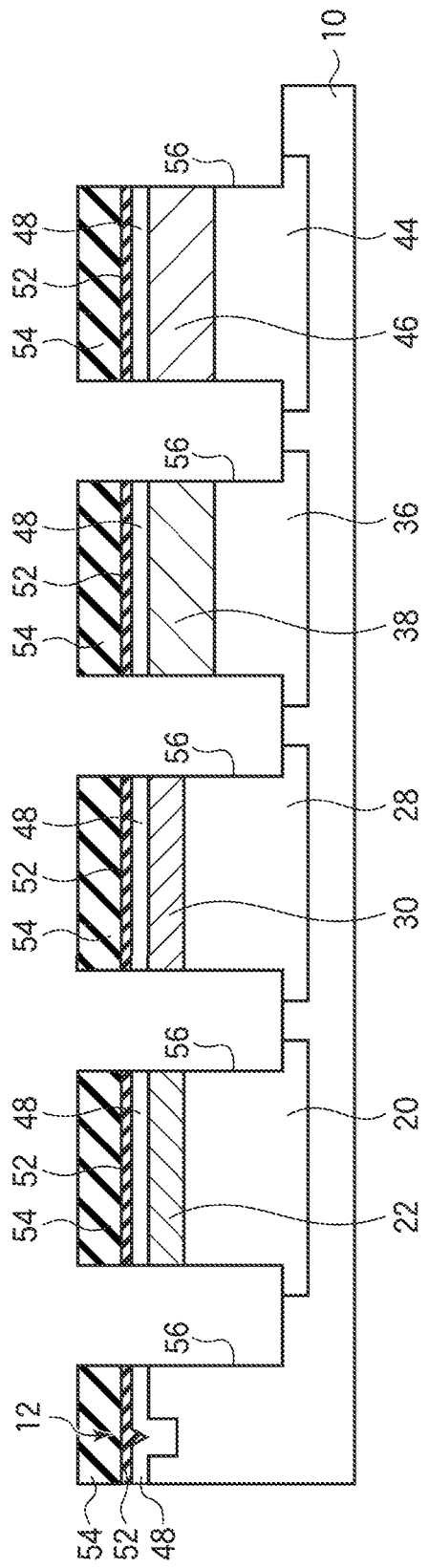
Figure 19A:
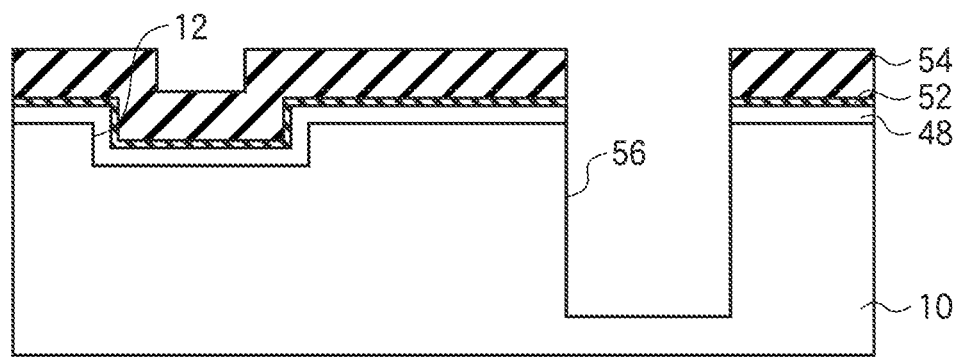

Next, by photolithography and dry etching, the silicon nitride film 54, the silicon oxide film 52, the silicon layer 48 and the silicon substrate 10 are anisotropically etched to form a device isolation trench 56 in the device isolation region containing the regions between the respective transistor forming regions (FIGS. 8, 19A). For the alignment for the photolithography, the trench 12 is used as the alignment mark.

Next, by, e.g., ISSG method, the surface of the silicon layer 48 and the silicon substrate 10 are wet oxidized under a decreased pressure to form a silicon oxide film of, e.g., a 2 nm-thickness as the liner film on the inside walls of the device isolation trench 56. As the processing conditions, for example, the temperature is set at 810° C., and the processing period of time is set at 12 seconds.

Next, by, e.g., high density plasma CVD method, a silicon oxide film of, e.g., a 500 nm-thickness is deposited to fill the device isolation trench 56 by the silicon oxide film.

Figure 9:
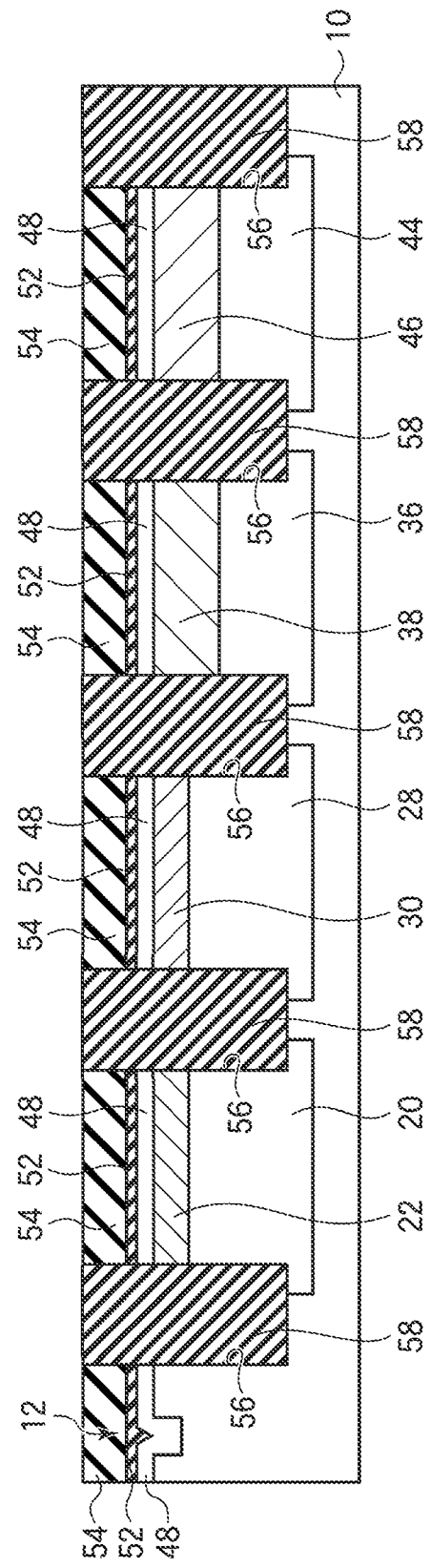
Figure 19B:
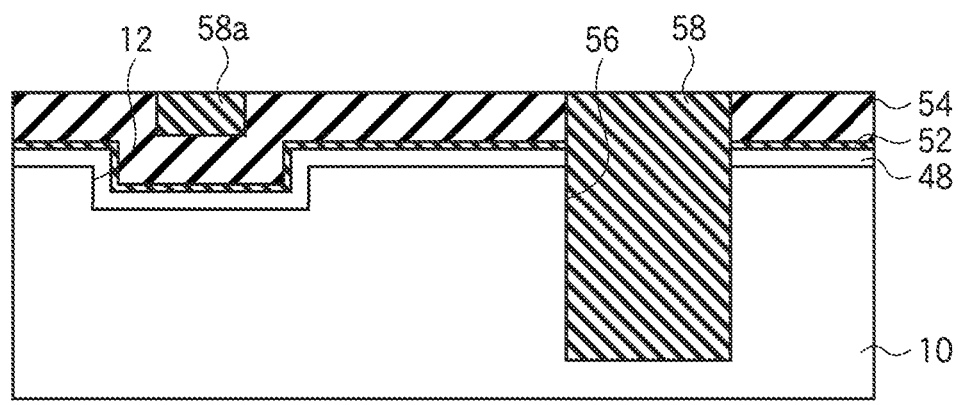

Then, by, e.g., CMP method, the silicon oxide film above the silicon nitride film 54 is removed. Thus, by the so-called STI (Shallow Trench Isolation) method, the device isolation insulating film 58 of the silicon oxide film buried in the device isolation trench 56 is formed (FIG. 9). At this time, also in the step of the surface of the silicon nitride film 54 above the trench 12, the silicon oxide film 58a remains (FIG. 19B).

Next, by, e.g., wet etching with hydrofluoric acid aqueous solution and with the silicon nitride film 54 as the mask, the device isolation insulating film 58 is etched by, e.g., about 30 nm. This etching is for adjusting the surface of the silicon layer 48 of the completed transistors and the surface of the device isolation insulating film 58 to be on the substantially the same height.

Figure 20A:
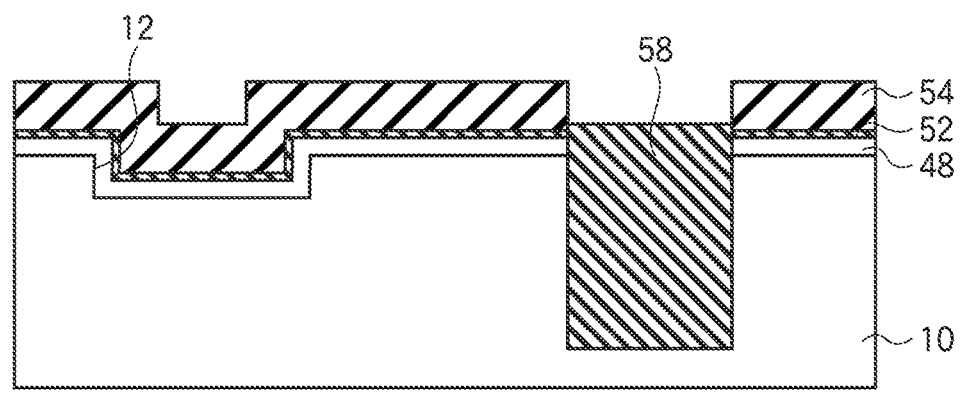

The film thickness of the silicon oxide film 58a remaining above the silicon nitride film 54 is about 50 nm at maximum equivalent to the step of the trench 12. The actual film thickness is smaller than 50 nm because of over-polishing by the CMP. Accordingly, the silicon oxide film 58a remaining above the silicon nitride film 54 is completely removed by the etching for adjusting the height of the device isolation insulating film 58 (FIG. 20A).

Figure 20B:
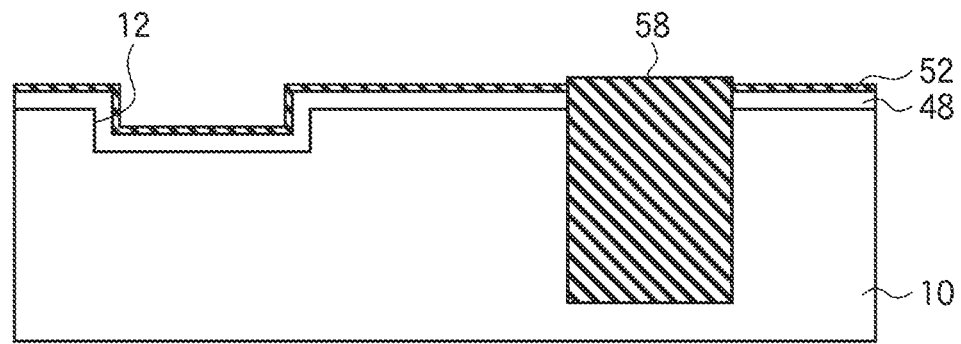

Then, by wet etching with, e.g., hot phosphoric acid, the silicon nitride film 54 is removed. At this time, the silicon oxide film 58a is not left on the silicon nitride film 54, and the silicon nitride film 54 in the trench 12 can be completely removed (FIG. 20B). Thus, no step of an indefinite depth is never formed, and the silicon oxide film 58a never disperses.

Next, by wet etching using, e.g., hydrofluoric acid aqueous solution, the silicon oxide film 52 is removed. At this time, to completely remove the silicon oxide film 52, the 3 nm-thickness silicon oxide film 52 is etched by a film thickness equivalent to a 5 nm-thickness of thermal oxidation film.

For the silicon oxide film of the device isolation insulating film 58, which has been deposited by high density plasma CVD method, the etching rate to hydrofluoric acid aqueous solution is about twice the etching rate for thermal oxidation film. If impurity ions are implanted in the silicon oxide film, although depending on an ionic species, the etching rate is further increased. High temperature thermal processing can lower the etching rate but is not preferable so as to realize steep channel impurity distributions.

In the present embodiment, in which no impurity ions are implanted in the silicon oxide film forming the device isolation insulating film 58, the etching amount of the device isolation insulating film 58 accompanying the etching of the silicon oxide film 52 can be suppressed to be as small as 10 nm.

Figure 10:
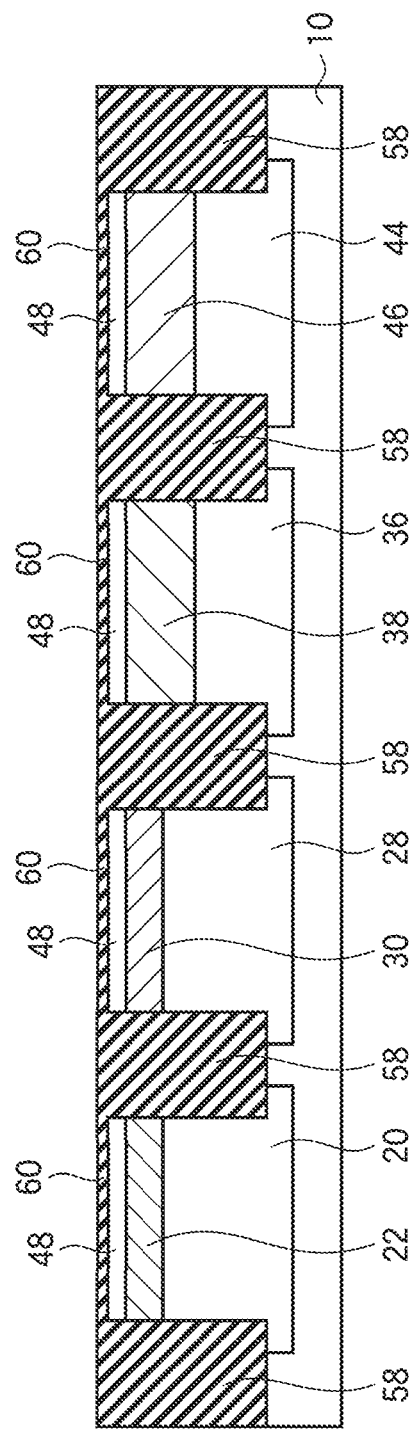

Next, by thermal oxidation method, a silicon oxide film 60 of, e.g., a 7 nm-thickness is formed (FIG. 10). As the processing conditions, for example, the temperature is set at 750° C., and the processing period of time is set at 52 minutes.

Next, by photolithography, a photoresist film 62 covering the high voltage NMOS transistor forming region 32 and the high voltage PMOS transistor forming region 40 and exposing the reset region is formed.

Figure 11:
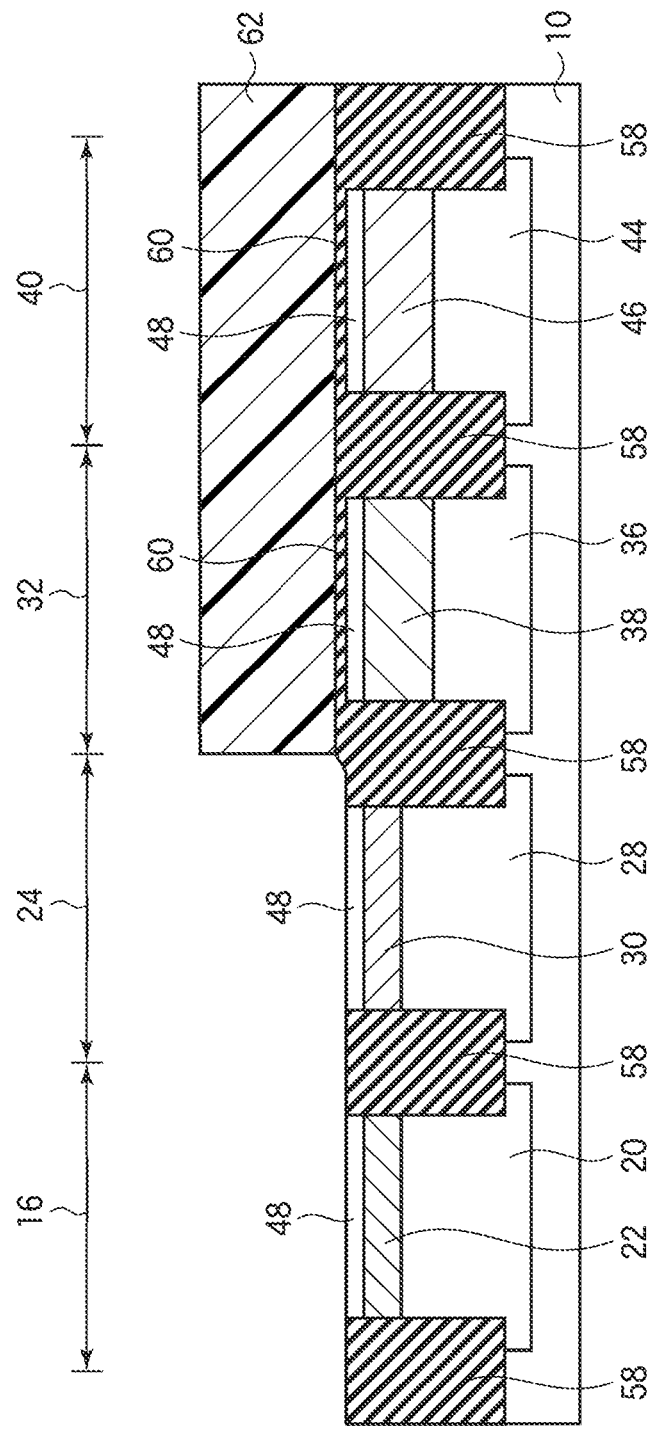

Then, by, e.g., wet etching with hydrofluoric acid aqueous solution and with the photoresist film 62 as the mask, the silicon oxide film 60 is etched. Thus, the silicon oxide film 60 in the low voltage NMOS transistor forming region 16 and the low voltage PMOS transistor forming region 24 is removed (FIG. 11). At this time, to completely remove the silicon oxide film 60, the 7 nm-thickness silicon oxide film 60 is etched by a film thickness equivalent to a 10 nm-thickness of thermal oxidation film.

For the silicon oxide film of the device isolation insulating film 58, which has been deposited by high density plasma CVD method, the etching rate to hydrofluoric acid aqueous solution is about twice the etching rate for thermal oxidation film. If impurity ions are implanted in the silicon oxide film, although depending on an ionic species, the etching rate is further increased. High temperature thermal process can lower the etching rate but is not preferable so as to realize steep channel impurity distributions.

In the present embodiment, in which no impurity ions are implanted in the silicon oxide film forming the device isolation insulating film 58, the etching amount of the device isolation insulating film 58 accompanying the etching of the silicon oxide film 60 can be suppressed to be as small as 20 nm.

Thus, the total etching amount of the device isolation insulating film 58 in removing the silicon oxide films 52, 60 can be suppressed to be as small as about 10 nm in the high voltage transistor forming regions 32, 40 and about 30 nm in the low voltage transistor forming regions 16, 24.

Then, by, e.g., asking method, the photoresist film 62 is removed.

Next, by thermal oxidation method, a silicon oxide film 64 of, e.g., a 2 nm-thickness is formed. As the processing conditions, for example, the temperature is set at 810° C., and the processing period of time is set at 8 seconds.

Next, thermal processing of, e.g., 870° C. and 13 seconds is made in NO atmosphere to introduce nitrogen into the silicon oxide films 60, 64.

Figure 12:
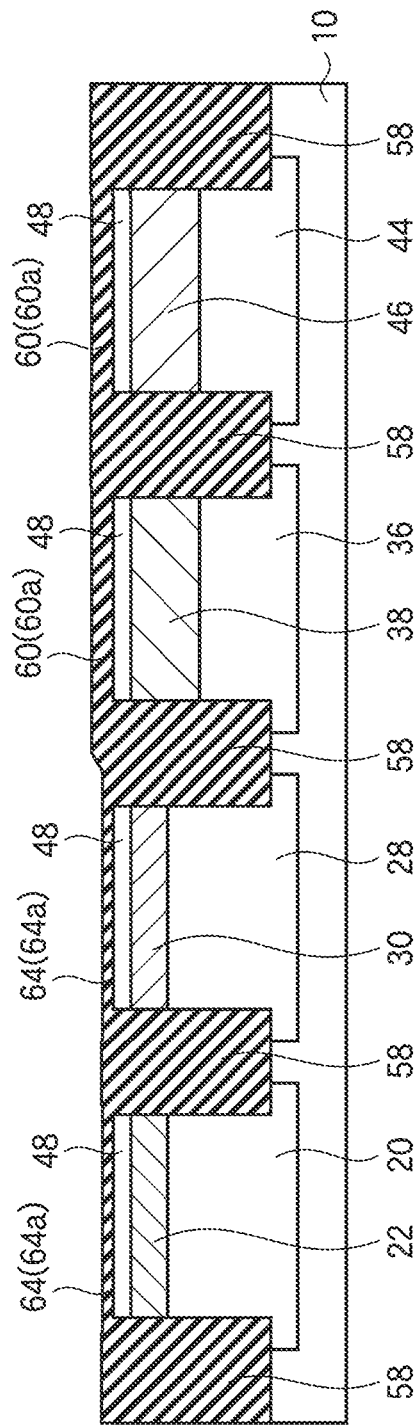

Thus, the gate insulating films 60a of the silicon oxide film 60 are formed in the high voltage NMOS transistor forming region 32 and the high voltage PMOS transistor forming region 40. In the low voltage NMOS transistors forming region 16 and the low voltage PMOS transistors forming region 24, the gate insulating films 64a of the silicon oxide film 64 thinner than the silicon oxide film 60 are formed (FIG. 12).

Figure 21A:
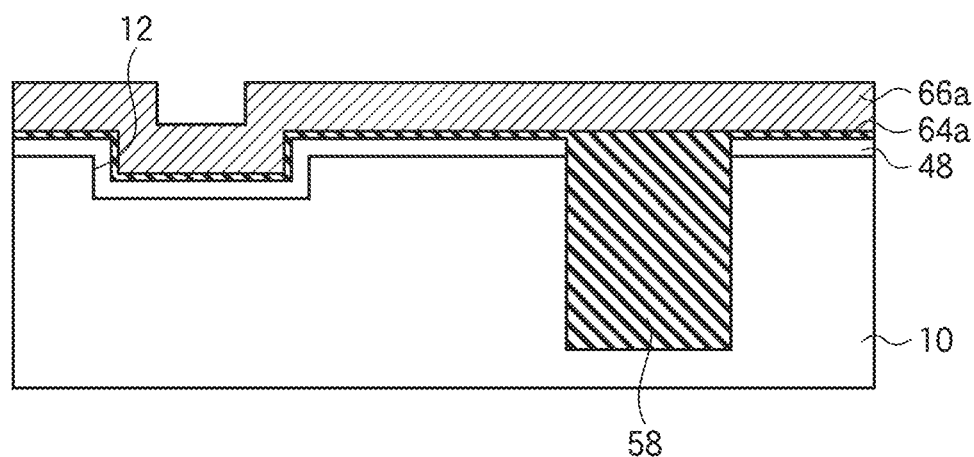

Then, above the entire surface, a non-doped polycrystalline silicon film 66a of, e.g., a 100 nm-thickness is deposited by, e.g., LPCVD method (FIG. 21A). As the processing conditions, for example, the temperature is set at 605° C.

Figure 13:
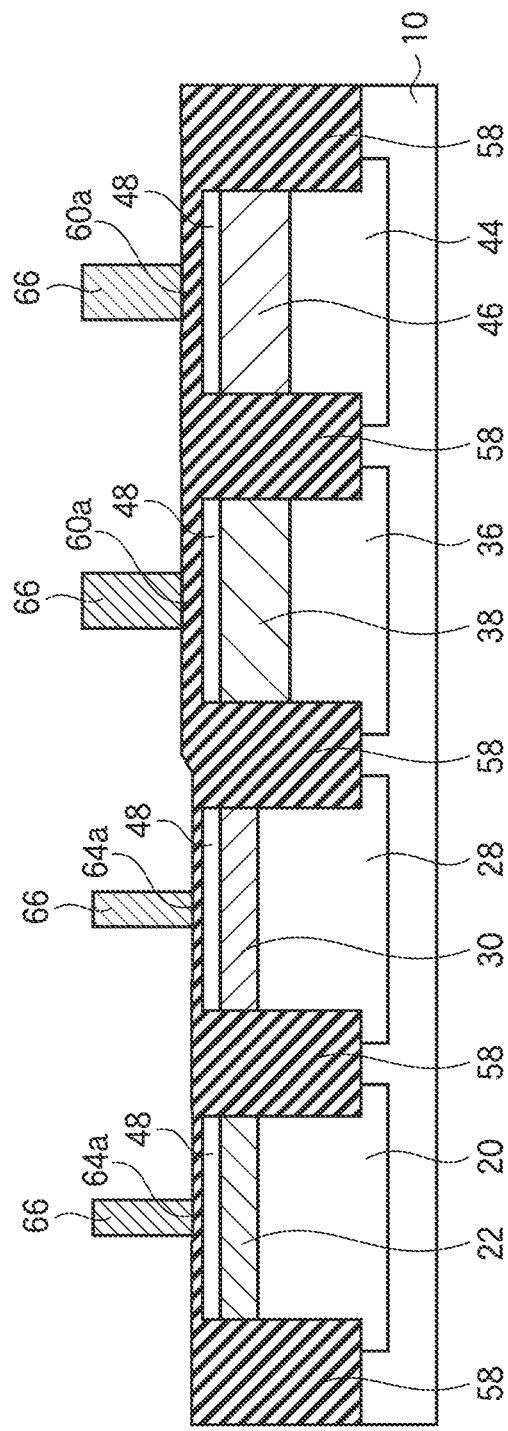

Next, by photolithography and dry etching, the polycrystalline silicon film 66a is patterned to form the gate electrodes 66 in the respective transistor forming regions (FIG. 13).

Figure 21B:
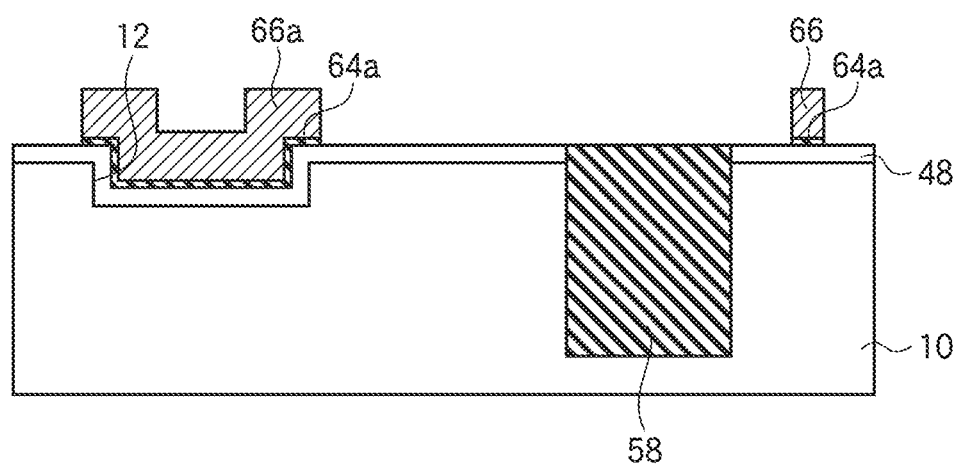

Simultaneously therewith, the polycrystalline silicon film 66a is so patterned that the polycrystalline silicon film 66a remains, covering the entire alignment mark forming region formed by the trench 12 (FIG. 21B). Thus, the polycrystalline silicon film 66a remains as the side wall in the alignment mark formed region, which prevents disadvantages of dispersions, etc. in later steps.

Next, by photolithography and ion implantation, n-type impurity ions are implanted selectively in the high voltage NMOS transistor forming region 32 with the gate electrode 66 as the mask to form n-type impurity layers 68 to be the LDD regions. The n-type impurity layers 68 are formed by implanting, e.g., phosphorus ions under the conditions of 35 keV acceleration energy and $2\times10^{13}$ cm$^{-2}$ dose.

Next, by photolithography and ion implantation, p-type impurity ions are implanted selectively in the high voltage PMOS transistor forming region 40 with the gate electrode 66 as the mask to form p-type impurity layers 70 to be the LDD regions. The p-type impurity layers 70 are formed by implanting, e.g., boron ions under the conditions of 10 keV acceleration energy and $2\times10^{13}$ cm$^{-2}$ dose.

Next, by photolithography and ion implantation, n-type impurity ions are implanted selectively in the low voltage NMOS transistor forming region 16 with the gate electrode 66 as the mask to form n-type impurity layers to be the extension regions. The n-type impurity layers 72 are formed by implanting, e.g., arsenic ions at 6 keV acceleration energy and $2\times10^{14}$ cm$^{-2}$ dose.

Figure 14:
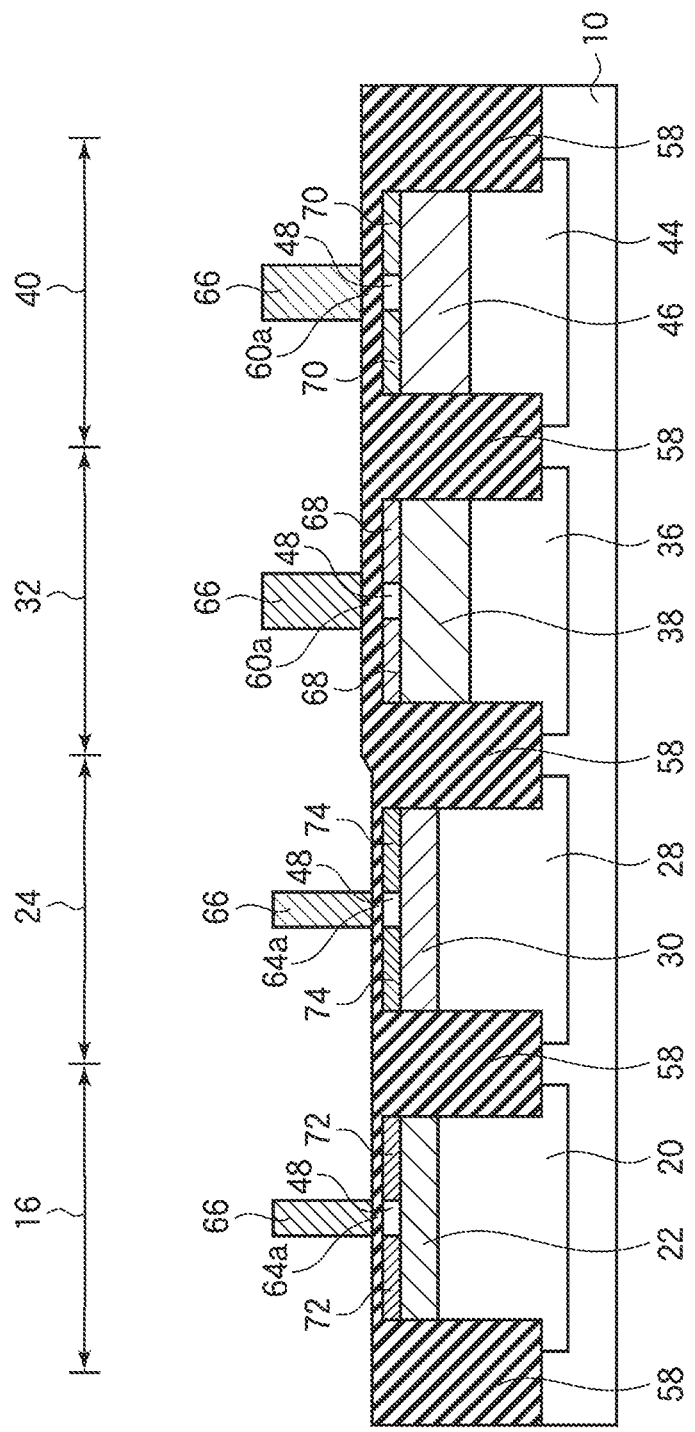

Then, by photolithography and ion implantation, p-type impurity ions are implanted selectively in the low voltage PMOS transistor forming region 24 with the gate electrode 66 as the mask to form p-type impurity layers to be the extension regions (FIG. 14). The p-type impurity layers 74 are formed by implanting, e.g., boron ions at 0.6 keV acceleration energy and $7\times10^{14}$ cm$^{-2}$ dose.

Then, above the entire surface, a silicon oxide film of, e.g., an 80 nm-thickness is deposited by, e.g., CVD method. As the processing condition, for example, the temperature is set at 520° C.

Figure 15:
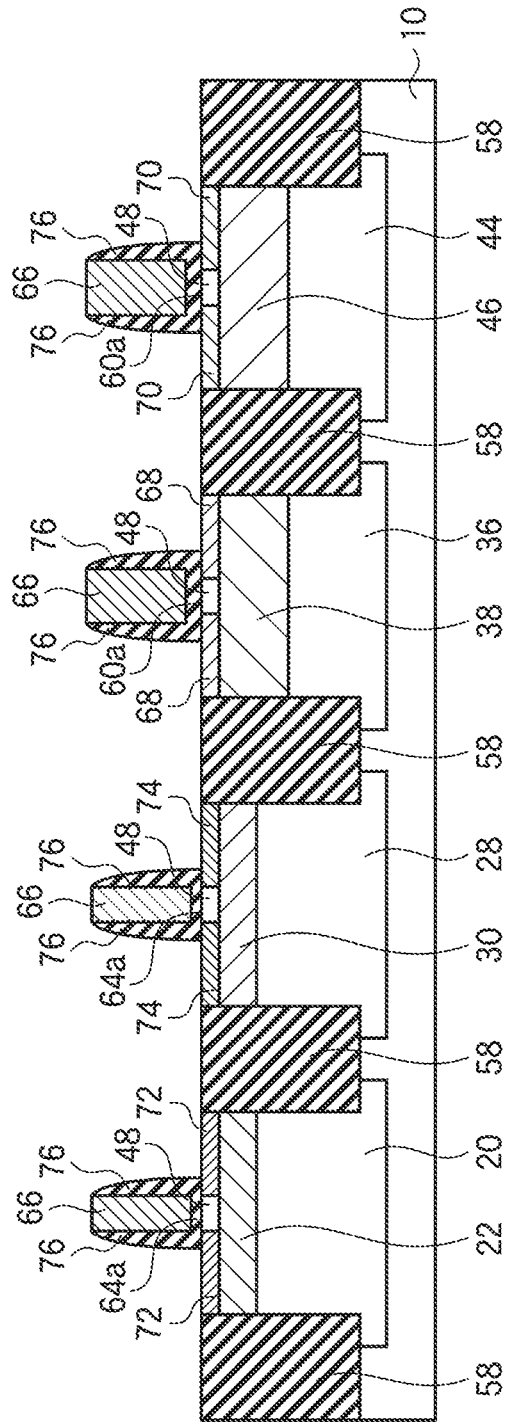

Next, the silicon oxide film deposited above the entire surface is anisotropically etched to be left selectively on the side walls of the gate electrodes 66. Thus, the sidewall spacers 76 of the silicon oxide film are formed (FIG. 15).

Next, by photolithography and ion implantation, ion implantation is made selectively in the low voltage NMOS transistor forming region 16 and the high voltage NMOS transistor forming region 32 with the gate electrodes 66 and the sidewall spacers 76 as the mask. Thus, the n-type impurity layers 78 to be the source/drain regions are formed, and n-type impurities are doped to the gate electrodes 66 of the NMOS transistors. As the conditions for the ion implantation, for example, phosphorus ions are implanted at 8 keV acceleration energy and at $1.2\times10^{16}$ cm$^{-2}$ dose.

Next, by photolithography and ion implantation, ion implantation is made selectively in the low voltage PMOS transistor forming region 24 and the high voltage PMOS transistor forming region 40 with the gate electrodes 66 and the sidewall spacers 76 as the mask. Thus, the p-type impurity layers 80 to be the source/drain regions are formed, and p-type impurities are doped to the gate electrodes 66 of the PMOS transistors. As the conditions for the ion implantation, for example, boron ions are ion implanted at 4 keV acceleration energy and $6\times10^{15}$ cm$^{-2}$ dose.

Then, rapid thermal processing of, e.g., 1025° C. and 0 second is made in an inert gas ambient atmosphere to activate the implanted impurities and diffuse the impurities in the gate electrodes 66. The thermal processing of 1025° C. and 0 second is sufficient to diffuse the impurities to the interfaces between the gate electrodes 66 and the gate insulating films.

The channel portions of the low voltage NMOS transistor can retain steep impurity distributions by carbon suppressing the diffusion of boron, and the channel portions of the low voltage PMOS transistor can retain steep impurity distributions by the slow diffusion of arsenic or antimony. On the other hand, the channel portion of the high voltage NMOS transistor, in which no carbon is implanted, the diffusion is not suppressed, and the channel portion of the high voltage PMOS transistor, in which phosphorus, whose diffusion constant is larger than arsenic or antimony, can have gradual impurity distribution.

Figure 16:
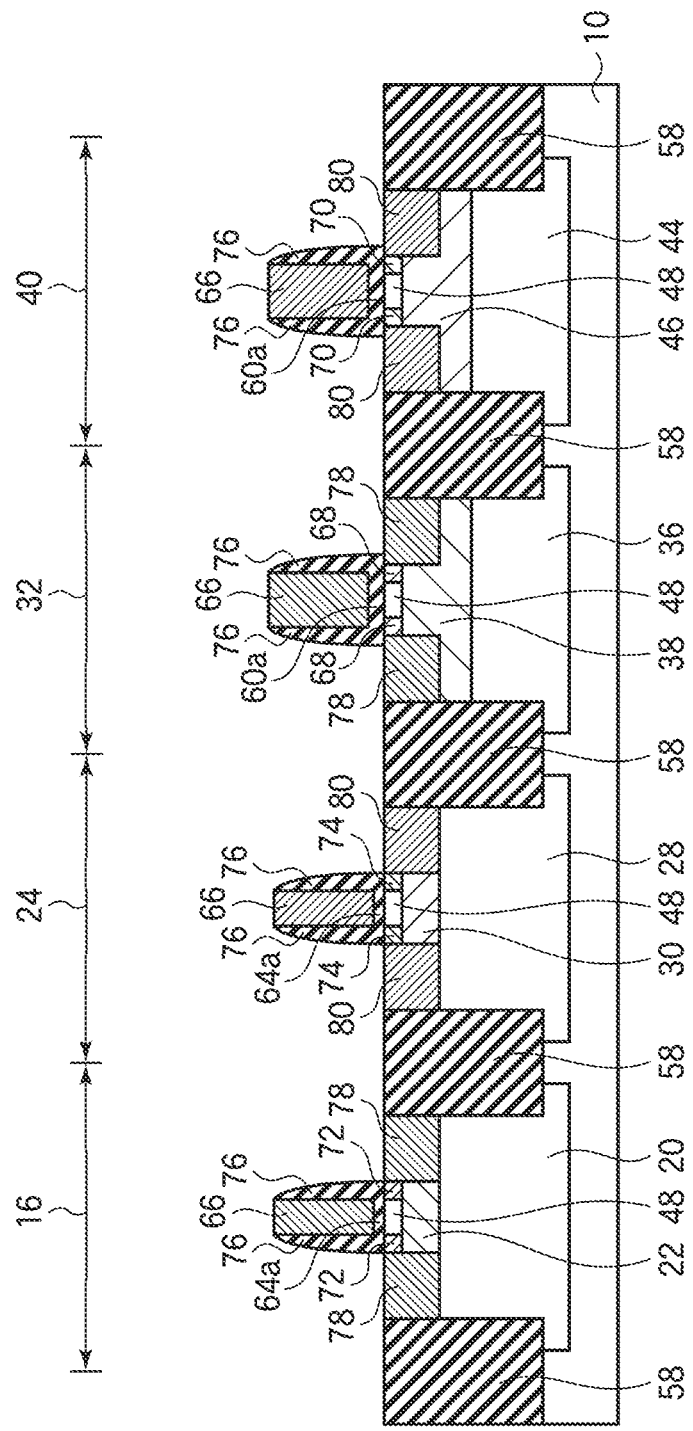

Thus, the 4 kinds of the transistors are completed on the silicon substrate 10. That is, in the low-voltage NMOS transistor forming region 16, the low-voltage NMOS transistor (LV NMOS) is formed. In the low-voltage PMOS transistor forming region 24, the low-voltage PMOS transistor (LV PMOS) is formed. In the high voltage NMOS transistor forming region, the high voltage NMOS transistor (HV NMOS) is formed. In the high voltage PMOS transistor forming region, the high voltage PMOS transistor (HV PMOS) is formed (FIG. 16).

Then, by salicide (self-aligned silicide) process, a metal silicide film 84 of, e.g., a cobalt silicide film is formed on the gate electrodes 66, the n-type impurity layers 78 and the p-type impurity layers 80.

Next, above the entire surface, a silicon nitride film of, e.g., a 50 nm-thickness is deposited by, e.g., CVD method to form the silicon nitride film as the etching stopper film.

Next, above the silicon nitride film, a silicon oxide film of, e.g., a 500 nm-thickness is deposited by, e.g., high density plasma CVD method.

Thus, the inter-layer insulating film 86 of the layer film of the silicon nitride film and the silicon oxide film is formed.

Next, the surface of the inter-layer insulating film 86 is polished by, e.g., CMP method to planarize.

Figure 17:
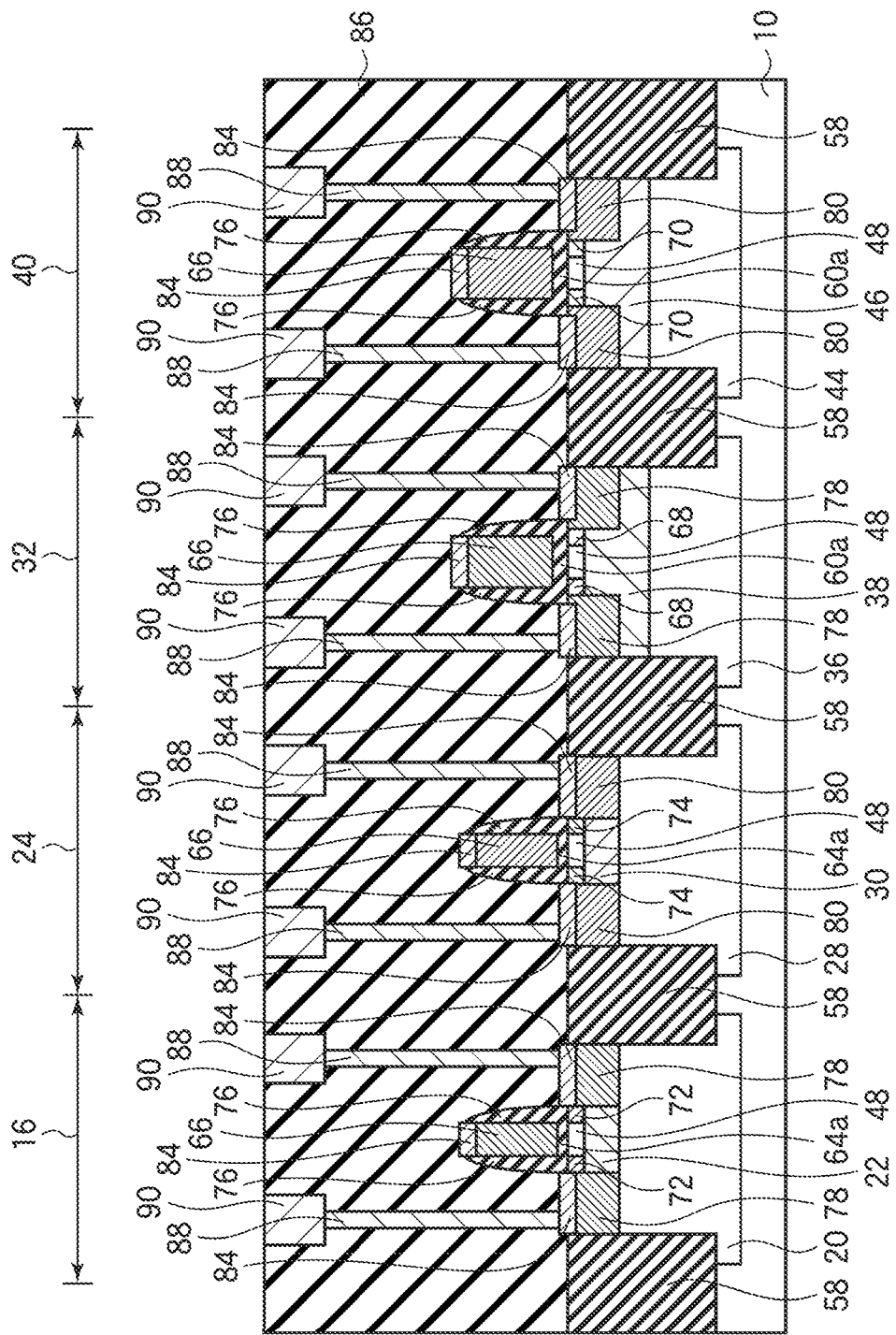

Then, the contact plugs 88 buried in the inter-layer insulating film 86, interconnections 90 connected to the contact plugs 88, and others are formed, and the semiconductor device is completed (FIG. 17).

As described above, in the method of manufacturing the semiconductor device according to the present embodiment, the depth of the trench 12 is smaller than the film thickness of the silicon nitride film 54 to be used as the mask film for forming the device isolation trenches 56. The reason for this will be detailed with reference to FIGS. 22A to 25.

Figure 22A:
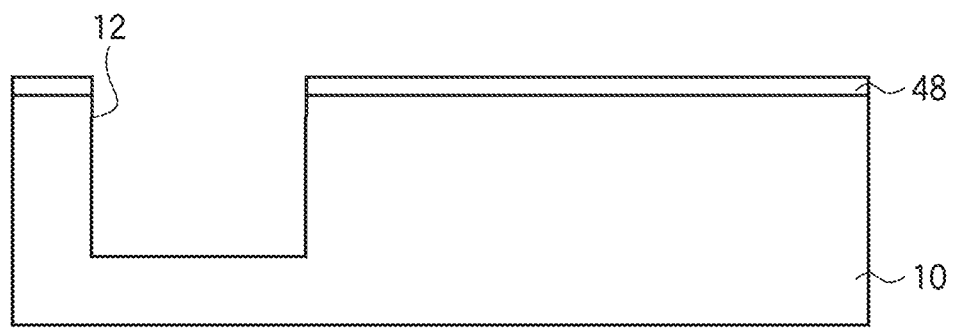

It is assumed that a trench 12 whose depth is larger than the film thickness of the silicon nitride film 54 is formed in the step corresponding to FIG. 18A. For example, the trench 12 of, e.g., a 200 nm-depth is formed (FIG. 22A).

Figure 22B:
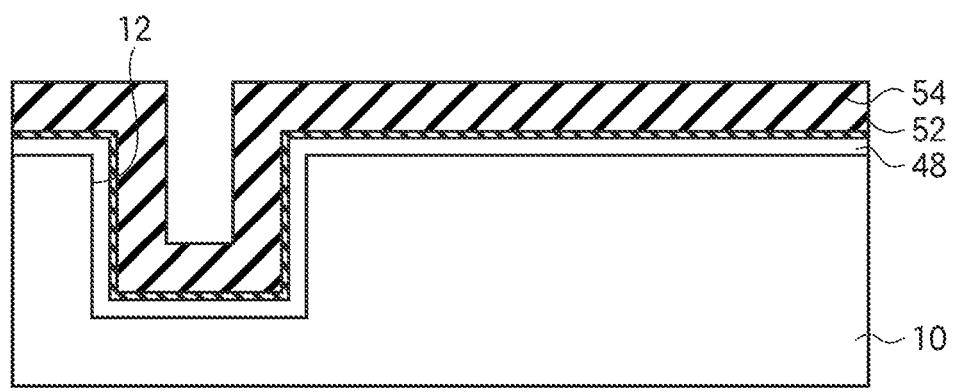

Then, in the step corresponding to FIG. 18B, the silicon layer 48, the silicon oxide film 52 and the silicon nitride film 54 are formed. The film thickness of the silicon nitride film 54 is set at a film thickness, e.g., 90 nm smaller than the depth of the trench 12. The silicon nitride film 54 is formed in the trench 12 along the inside surface thereof (FIG. 22B).

Figure 23A:
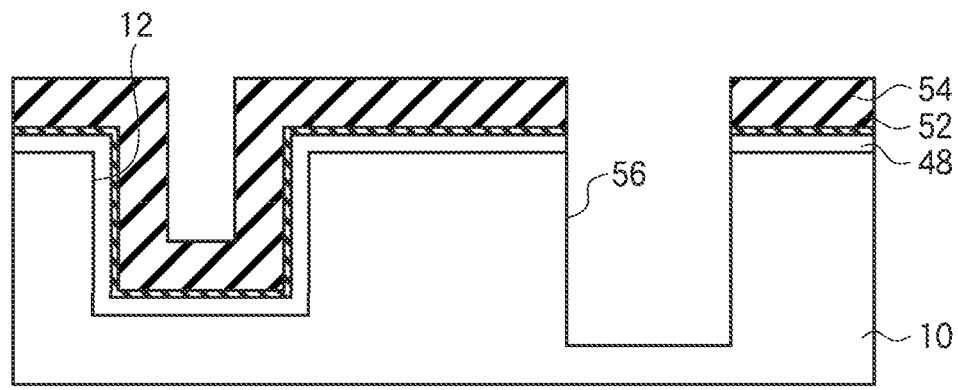

Next, in the step corresponding to FIG. 19A, the device isolation trench 56 is formed in the silicon layer 48 and the silicon substrate 10 (FIG. 23A).

Figure 23B:
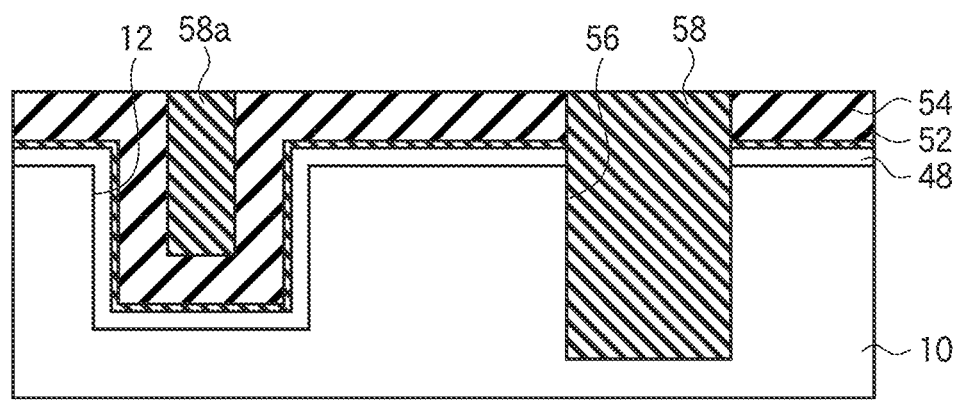

Next, in the step corresponding to FIG. 19B, the device isolation insulating film 58 buried in the device isolation trench 56 is formed. At this time, the silicon oxide film 58a remains also on the step of the surface of the silicon nitride film 54 above the trench 12 (FIG. 23B).

Figure 24A:
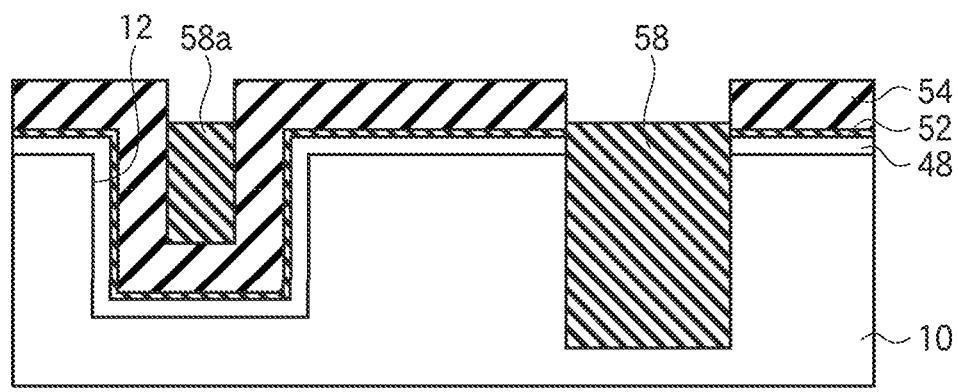

Next, in the step corresponding to FIG. 20A, to adjust the height of the device isolation insulating film 58, the device isolation insulating film 58 is etched by, e.g., about 30 nm. At this time, the silicon oxide film 58a remaining above the trench 12 is also etched, but the silicon oxide film 58a buried in the deep step cannot be completely removed (FIG. 24A).

Then, in the step corresponding to FIG. 20B, the silicon nitride film 54 is removed. At this time, it is difficult to completely remove the silicon nitride film 54 because the silicon nitride film 54 is formed along the inside wall of the deep step, and the silicon oxide film 58a is formed on the inside of the silicon nitride film 54 (FIG. 24B).

Resultantly, a recess of a small width is undesirably formed between the silicon oxide film 52 and the silicon oxide film 58a in the trench 12. The depth of the recess varies depending on variations of the etching rate of the silicon nitride film 54. Such narrow recess is a cause for generating residues and coating nonuniformalities of photoresists in later steps.

Figure 25:
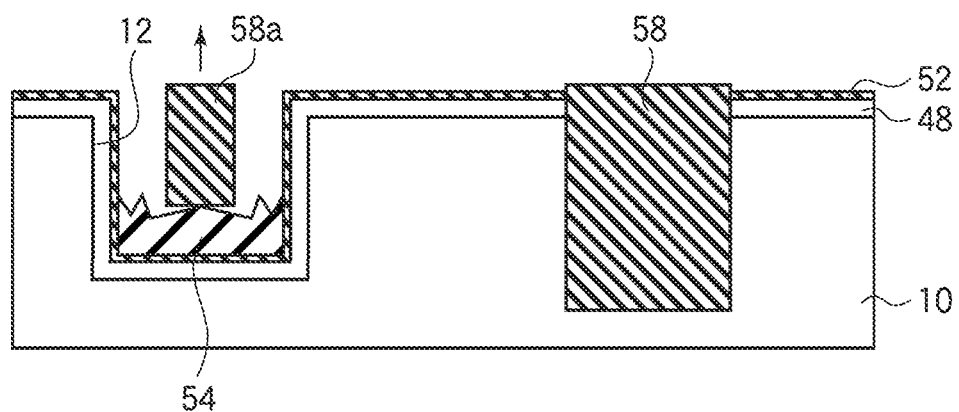

When the over-etching amount is increased in order to completely remove the silicon nitride film 54, the silicon nitride film 54 above the bottom of the trench 12 is removed, and the silicon oxide film 58a buried in the trench 12 loses the support and lifted off the wafer, and disperses (FIG. 25). The silicon oxide film 58a which has dispersed adheres to other parts, which are often a cause, etc. for defective patterns in later steps.

Figure 24B:
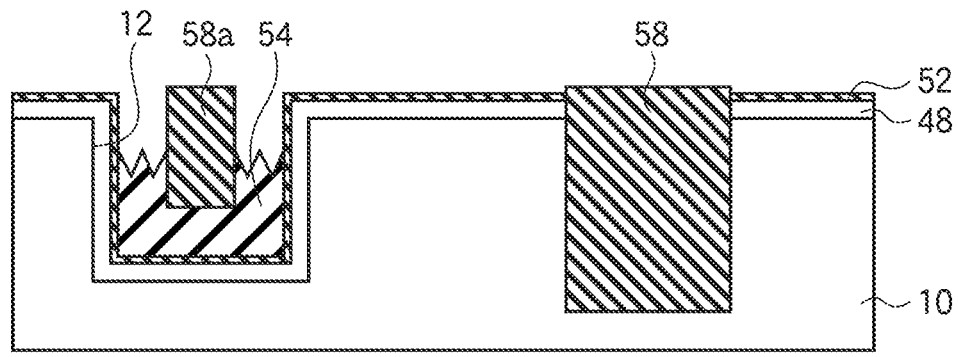

The depth of the trench 12 is smaller than the film thickness of the silicon nitride film 54 as in the method of manufacturing the semiconductor device according to the present embodiment, whereby the silicon oxide film 58a and the silicon nitride film 54 are prevented from remaining respectively in the step of FIG. 24A and in the step of FIG. 24B. Thus, the above-described inconveniences can be prevented.

In the method of manufacturing the semiconductor device according to the present embodiment, the polycrystalline silicon film 66a for forming the gate electrodes 66 is left, covering all the alignment mark forming region formed by the trench 12. The reason for this will be detailed with reference to FIGS. 26A and 26B.

Figure 26A:
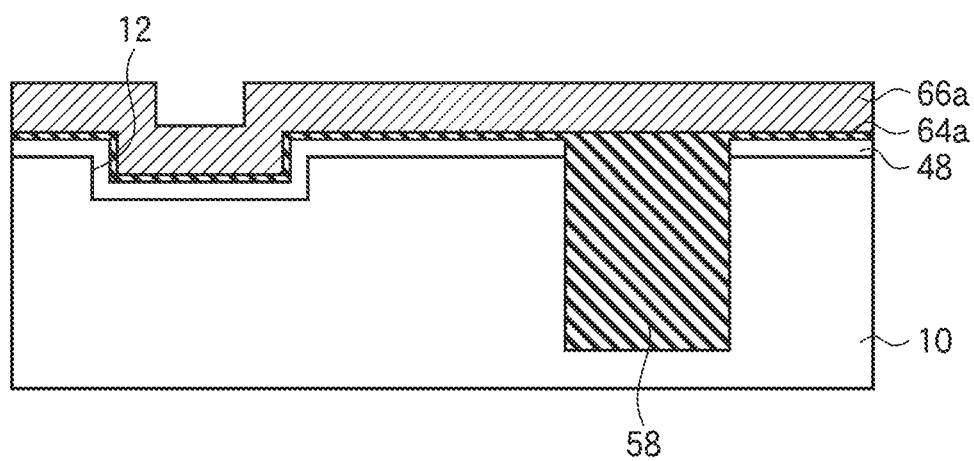

In the step corresponding to FIG. 21A, the polycrystalline silicon film 66a is formed on the gate insulating film 64a (FIG. 26A).

Figure 26B:
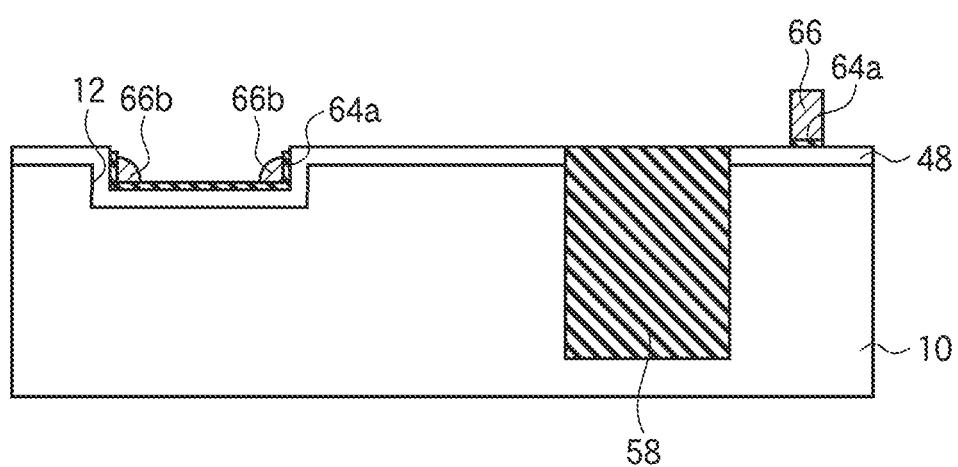

Next, in the step corresponding to FIG. 21B, the gate electrode 66 is formed. At this time, in the step reflecting the configuration of the trench 12, the polycrystalline silicon film 66a is left in a sidewall-like residue 66b (FIG. 26B).

The residue 66b generated in the step of the trench 12, when the over-etching quantity is increased, becomes thinner, smaller and often particles to be lifted off and disperse in the later hydrofluoric acid processing step. The dispersing residue 66b, when it adheres to other parts, often becomes a cause, etc. for pattern defects in later steps.

The polycrystalline silicon film 66a remains in the entire alignment mark forming region as in the method of manufacturing the semiconductor device according to the present embodiment, whereby the generation of the sidewall-like residue of the polycrystalline silicon film can be prevented. Thus, the above-described inconveniences can be prevented.

As described above, according to the present embodiment, the depth of the trench as the alignment mark is smaller than a depth equivalent to the film thickness of the silicon nitride film used as the mask film in forming the device isolation insulating films, whereby the generation of residues of the mask film in the trench forming region can be prevented. The conductive film to be the gate electrodes remains all over the alignment mark forming region, whereby the generation of residues of the conductive film in the trench forming region can be prevented. Thus, the generation of pattern defects, etc.

due to the residues can be prevented. Consequently, the semiconductor device of high reliability can be manufactured.

Modified Embodiments

The above-described embodiment can cover other various modifications.

For example, the above-described embodiment is applied to the method of manufacturing the semiconductor device including the transistors including the epitaxial layers on the channel impurity layers but can be applied to the methods of manufacturing other semiconductor devices.

The method described in the embodiment described above can be applied widely to methods of manufacturing the semiconductor devices including before the step of forming the device isolation insulating film, photolithographic steps using as the alignment marks the trenches formed in the semiconductor substrates.

In the above-described embodiment, the conductive film to be the gate electrode is left all over the alignment mark forming region, but the conductive film to be the gate electrode is not essential. The above-described problem occurs commonly in cases that a step reflecting a convex and concavity of the surface of the trench is formed in the surface for the conductive film to be formed on.

The structure, the constituent material, the manufacturing conditions, etc. of the semiconductor device described in the embodiment described above are one example and can be changed or modified suitably in accordance with the technical common sense, etc. of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:
    forming a trench to be an alignment mark in a semiconductor substrate;
    forming a mask film exposing a region to be a device isolation region and covering a region to be a device region by aligning with the alignment mark above the semiconductor substrate with the trench formed in;
    anisotropically etching the semiconductor substrate with the mask film as a mask to form a device isolation trench in the region to be the device isolation region of the semiconductor substrate; and
    burying the device isolation trench by an insulating film to form a device isolation insulating film, wherein
    in forming the trench, the trench is formed in a depth which is smaller than a depth equivalent to a thickness of the mask film.

2. The method of manufacturing a semiconductor device according to claim 1, further comprising, after forming the device isolation insulating film:
    forming a conductive film; and
    patterning the conductive film to form an interconnection, wherein
    in forming the interconnection, the conductive film is so patterned that the conductive film remains all over the region where the trench is formed.

3. The method of manufacturing a semiconductor device according to claim 1, wherein
    the interconnection is a gate electrode.

4. The method of manufacturing a semiconductor device according to claim 1, further comprising after forming the trench and before forming the mask film:
    implanting prescribed impurity ions in a prescribed region of the semiconductor substrate in alignment with the alignment mark.

5. The method of manufacturing a semiconductor device according to claim 1, further comprising after forming the trench and before forming the mask film:
    forming an epitaxial semiconductor layer above the semiconductor substrate.

6. The method of manufacturing a semiconductor device according to claim 1, wherein
    forming the mask film includes:
        forming the mask film above the semiconductor substrate with the trench formed in;
        forming above the mask film a photoresist film exposing the region to be the device isolation region and covering the region to be the device region in alignment with the alignment mark; and
        etching the mask film with the photoresist film as a mask to transfer a pattern of the photoresist film to the mask film.

* * * * *